(12) United States Patent
Pong et al.

(10) Patent No.: US 6,462,603 B1
(45) Date of Patent: Oct. 8, 2002

(54) SOLID-STATE RELAY

(76) Inventors: Bryan M. H. Pong, Room 1616, Block D, Kornhill, Quarry Bay (HK); Percival Jim, 16 Floor, Flat A1 Man On House 151 Wanchai Road, Wanchai (HK)

( * ) Notice: Subject to any disclaimer, the term of this patent is extended or adjusted under 35 U.S.C. 154(b) by 988 days.

(21) Appl. No.: 08/512,368

(22) Filed: Aug. 8, 1995

(51) Int. Cl.[7] .............................................. H03K 17/00
(52) U.S. Cl. ...................... 327/365; 327/170; 327/374
(58) Field of Search ............................. 326/113, 85, 87, 326/91; 327/170, 324, 389, 436, 365, 427; 307/112, 113, 132 E, 132 M, 139, 141.8, 115, 125, 126, 130, 131, 132 R

(56) References Cited

U.S. PATENT DOCUMENTS

| | | | |
|---|---|---|---|
| 4,961,010 A | * 10/1990 | Davis ........................ 307/443 |
| 5,194,765 A | * 3/1993 | Dunlop et al. ................. 326/87 |
| 5,231,311 A | * 7/1993 | Ferry et al. .................... 326/87 |
| 5,477,130 A | * 12/1995 | Hashimoto et al. ........... 320/49 |
| 5,483,188 A | * 1/1996 | Frodsham ................... 327/170 |
| 5,583,384 A | * 12/1996 | Henry ........................ 307/113 |

* cited by examiner

Primary Examiner—Jeffrey Zweizig
(74) Attorney, Agent, or Firm—Robert E. Malm

(57) ABSTRACT

Apparatus for opening and closing electrical circuits including one or more normally-open switches and normally-closed switches. A normally-open switch includes at least one MOSFET assembly consisting of a plurality of MOSFETs of different current-carrying capacities connected in parallel and circuitry for turning on the MOSFETs in time sequence. The normally-closed switch includes a pnp bipolar transistor, an npn bipolar transistor, and a circuit for short-circuiting the emitter-base junctions of the two transistors. The base and the collector of the npn transistor are connected respectively to the collector and the base of the pnp transistor. The normally-open and normally-closed switches both include a means for accommodating a current flow in either direction through the switch terminals. The apparatus includes two relay control terminals for receiving a relay control voltage from an external source and includes a means for transforming the relay control voltage into the switch control voltage through one or more transformation stages where at least one transformation stage is coupled to the next transformation stage by a transformer.

40 Claims, 3 Drawing Sheets

SOLID-STATE RELAY

BACKGROUND OF THE INVENTION

This invention relates generally to relays and more specifically to solid-state relays having high current-carrying capacities.

Relays are widely used in railway traction systems as a means of remote control for a wide variety of applications. Mechanical relays have been an important component in traction systems. However, they contain moving parts which are subject to wear and tear, especially in busy systems in which the frequency of operation is high. Solid-state relays, which do not have mechanical moving parts and are therefore likely to offer improved reliability, are candidates to replace mechanical relays if they can be designed to meet the performance requirements of railway traction systems.

Solid-state relays are well-known in the electronics industry and their designs are based on various approaches. Many of them are AC types which are made up of thyristors or similar components. The AC type of solid-state relay cannot switch off by itself—it must be aided by the diminishing current in an AC system.

There are a few types of DC solid-state relays on the market which are able to switch off by themselves. However, none of them can meet the requirements of a traction system. Their leakage current is very often too high, or the current rating of the switch is too low. On the other hand, all of these solid state relay switches are of the "normally open" (NO) type. An NO switch remains open (non-conducting) when the solid-state relay is not energized. Also required in a railway traction system is the "normally closed" (NC) type switch. The NC switch remains closed (conducting) when the solid-state relay is not energized. Generally, a single package of two NO-type switches and two NC-type switches are required for traction applications.

SUMMARY OF THE INVENTION

The invention is an improved device for opening and closing an electrical circuit and may include one or more switches of two types: normally-open switches and normally-closed switches. A normally-open switch includes at least one MOSFET assembly consisting of a plurality of MOSFETs numbered from one to N connected in parallel, the n'th MOSFET having a greater current-carrying capacity than the (n−1)'th MOSFET, n taking on values between 2 and N. A switch control voltage in a normal voltage range causes the MOSFETs in the normally-open switch to be turned off while a switch control voltage in an activating voltage range causes the MOSFETs to be turned on. The normally-closed switch includes a pnp bipolar transistor, an npn bipolar transistor, and a means for short-circuiting the emitter-base junctions of the two transistors. The base and the collector of the npn transistor are connected respectively to the collector and the base of the pnp transistor. A switch control voltage in a normal voltage range causes the transistors to be turned on, and a switch control voltage in an activating voltage range causing the transistors to be turned off by short-circuiting the base-emitter junctions of the two transistors. The normally-open and normally-closed switches both include a means for accommodating a current flow in either direction through the switch terminals.

The normally-open switch includes a means for turning on the MOSFETs in time sequence, the n'th MOSFET being turned on after the (n−1)'th MOSFET, n taking on values between 2 and N and N being the number of MOSFETs in each MOSFET assembly. The normally-open switch also includes a means for discharging the gates of the MOSFETs when the switch control voltage enters the normal voltage range after having been in the activating voltage range.

When the normally-open switch comprises a single MOSFET assembly, the sources and the drains of the MOSFETs are connected through a diode bridge circuit to two switch terminals for connection to an external electrical circuit. When the normally-open switch comprises two MOSFET assemblies, the sources of the MOSFETs in the two MOSFET assemblies are connected together, and the drains are connected to two switch terminals for connection to an external electrical circuit.

When the switch is a normally-closed switch, the emitters of the pnp transistor and the npn transistor are connected through a diode bridge circuit to two switch terminals for connection to an external electrical circuit. The means for short-circuiting the base-emitter junction of the npn transistor is a MOSFET while the means for short-circuiting the base-emitter junction of the pnp transistor includes a second pnp transistor bridged across the base-emitter junction of the first pnp transistor.

The solid-state relay includes two relay control terminals for receiving a relay control voltage from an external source. The relay control voltage has a normal voltage range and an activating voltage range corresponding respectively to the normal voltage range and the activating voltage range of the switch control voltage. The solid-state relay also includes a means for transforming the relay control voltage into the switch control voltage through one or more transformation stages, at least one transformation stage being coupled to the next transformation stage by a transformer.

One of the transformation stages is a DC/AC converter stage which converts an input DC voltage to the DC/AC converter stage to an AC voltage when the relay control voltage is in the activating voltage range. The DC/AC converter stage transforms the input DC voltage to an AC voltage beginning at a predetermined time period after the relay control voltage enters the activating voltage range.

The solid-state relay includes a means for suppressing the transmission of switching noise resulting from the operation of the DC/AC converter stage out of the relay's enclosure via conductors connecting to the relay control terminals.

The power required to operate the relay is supplied by the external source through the relay control terminals. The relay further comprises a means for maintaining the current from the external source at a constant level while the relay control voltage is in the activating voltage range.

One of the transformation stages is an AC/DC converting stage which converts an AC relay control voltage or a DC relay control voltage of arbitrary polarity to a DC voltage having a predetermined polarity when the relay control voltage is in the activating voltage range. Another of the transformation stages converts the relay control voltage to a constant DC voltage when the relay control voltage is in the activating voltage range.

DESCRIPTION OF THE PREFERRED EMBODIMENTS

Figure 1:
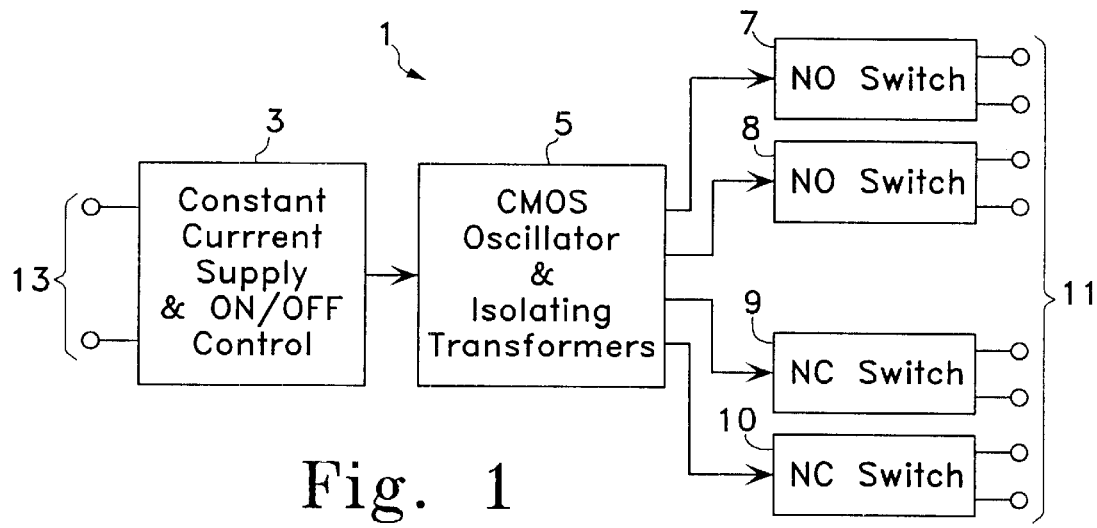
FIG. 1 shows a block diagram of the invention.

The preferred embodiment 1 of the present invention is shown in FIG. 1. It consists of a constant-current supply & on/off control unit 3, a CMOS oscillator & isolating transformers unit 5, two NO switches 7, 8 and two NC switches 9, 10. Each switch 7, 8, 9, and 10 is driven by its own switch control voltage and connects to external electrical apparatus via its own pair of switch terminals 11. The solid-state relay is controlled by a relay control voltage supplied by an external source at relay control terminals 13.

Figure 2:
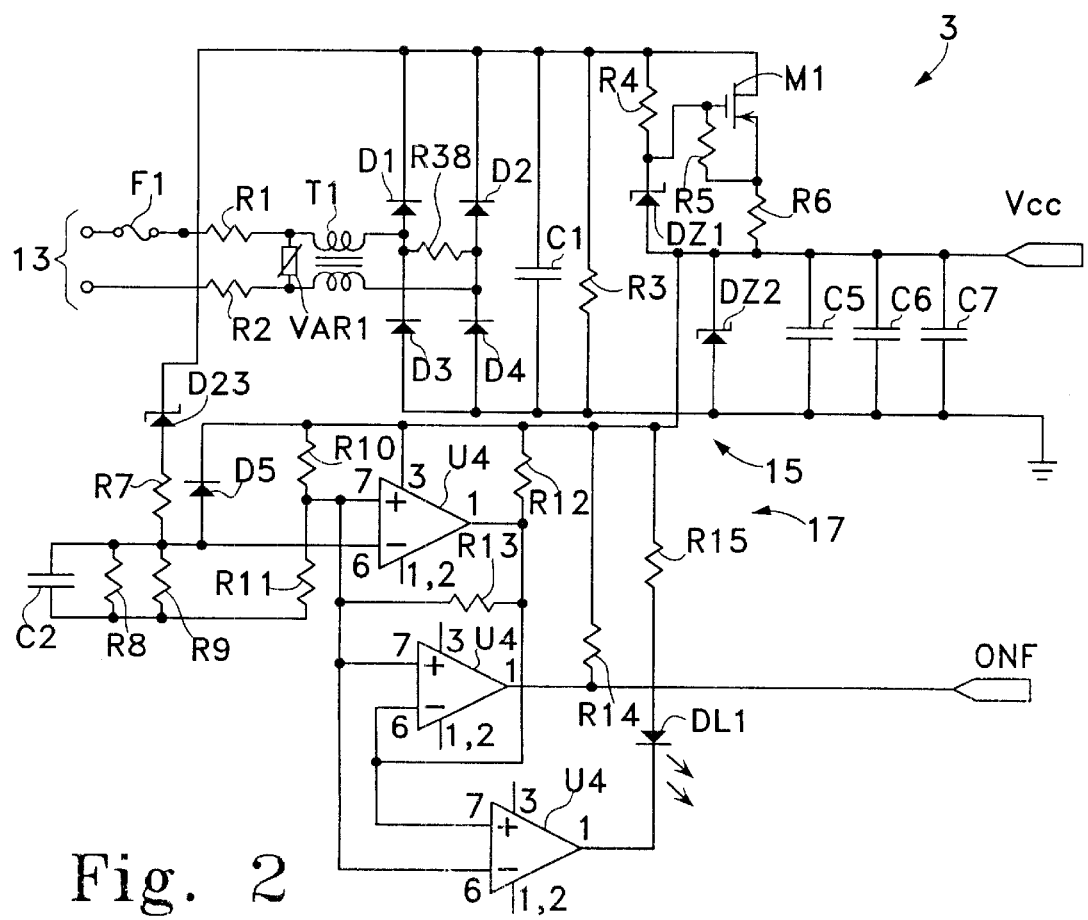
FIG. 2 shows the circuit diagram of the constant current supply & ON/OFF control unit.

The circuit diagram for the constant-current supply & on/off control unit 3 is shown in FIG. 2. The unit is powered by the relay control voltage that appears on relay control terminals 13. The upper section 15 utilizes the relay control voltage, when it is in an activating voltage range, in providing a constant current at a constant voltage to all of the control circuitry in the solid-state relay and enables the solid-state relay to operate properly with a large activating voltage range. The lower section 17 generates a signal with a predetermined delay that enables the operation of the CMOS oscillator in the CMOS oscillator & isolating transformers unit 5.

The current supplied to the unit at relay control terminals 13 flows through fuse F1, resistors R1 (150Ω) and R2 (150Ω), choke T1, and either diodes D1 and D4 or diodes D2 and D3 (all diodes 1N4007), depending on the polarity, and charges up capacitor C1 (1 $\mu$F). Fuse F1 isolates the circuit in case of short-circuits or faults. Resistors R1 and R2 limit the surge current that results when a step rise in the relay control voltage occurs. The common-mode choke T1 serves to reduce the magnitude of the switching noise that is coupled to the outside world via the conducting lines connecting to the relay control terminals 13. The diodes D1, D2, D3, and D4 establish a voltage of predetermined polarity across capacitor C1, regardless of the polarity of the relay control voltage. Thus, the relay control voltage may be either an AC voltage or a DC voltage of arbitrary polarity.

Varistor VAR1 (Marcon TNR9G361k) acts as a transient voltage arrestor, tending to suppress any voltage pulses that may occur on the lines. The resistor R38 sets the minimum operational current, and the resistor R3 (75 kΩ) discharges capacitor C1 when the relay control voltage falls below the activating voltage range.

When the voltage across capacitor C1 rises above 9.1 V, the Zener diode DZ1 (9.1 V) breaks down and serves to maintain the gate-source voltage of the MOSFET M1 at a constant value, resulting in a constant current through the MOSFET while the relay control voltage is in the activating voltage range. The magnitude of the current is determined by the breakdown voltage of the Zener diode DZ1 and the value of resistor R6 (390Ω). The resistor R4 (82 kΩ) limits the current that flows through the Zener diode DZ1. The Zener diode DZ2 (15 V) defines the voltage of the Vcc line. The capacitors C5, C6, and C7 (each 0.1 $\mu$F) are decoupling capacitors for the circuit.

The lower section 17 utilizes the voltage across capacitor C1 to charge up capacitor C2 (1 $\mu$F) through the Zener diode DZ3 (15 V) and resistor R7 (270 kΩ) to a voltage determined by R7, R8 (150 kΩ), and R9 (680 kΩ). The diode D5 (1N4148) provides a fast discharge path for C2 when power is removed from the switch terminals 11. When the voltage across capacitor C2 reaches a reference voltage defined by resistors R10 (820 kΩ) and R11 (820 kΩ), the quad comparator U4 (LM239) together with the resistors R12 (30 kΩ), R13 (330 kΩ), R14 (30 kΩ), and R15 (3.3 kΩ) cause a voltage to appear on the ONF line and the LED DL1 to light up.

The relay control voltage activates the switches by transitioning from a normal voltage range extending from 0 to 28 V to an activating voltage range extending from 50 to 138 V. The ONF voltage transitions from 0 V to 15 V approximately 40 ms after the relay control voltage transitions. The ONF voltage transitions from 15 V to 0 V approximately 10 ms after the relay control voltage transitions from the activating range to the normal range.

Figure 3:
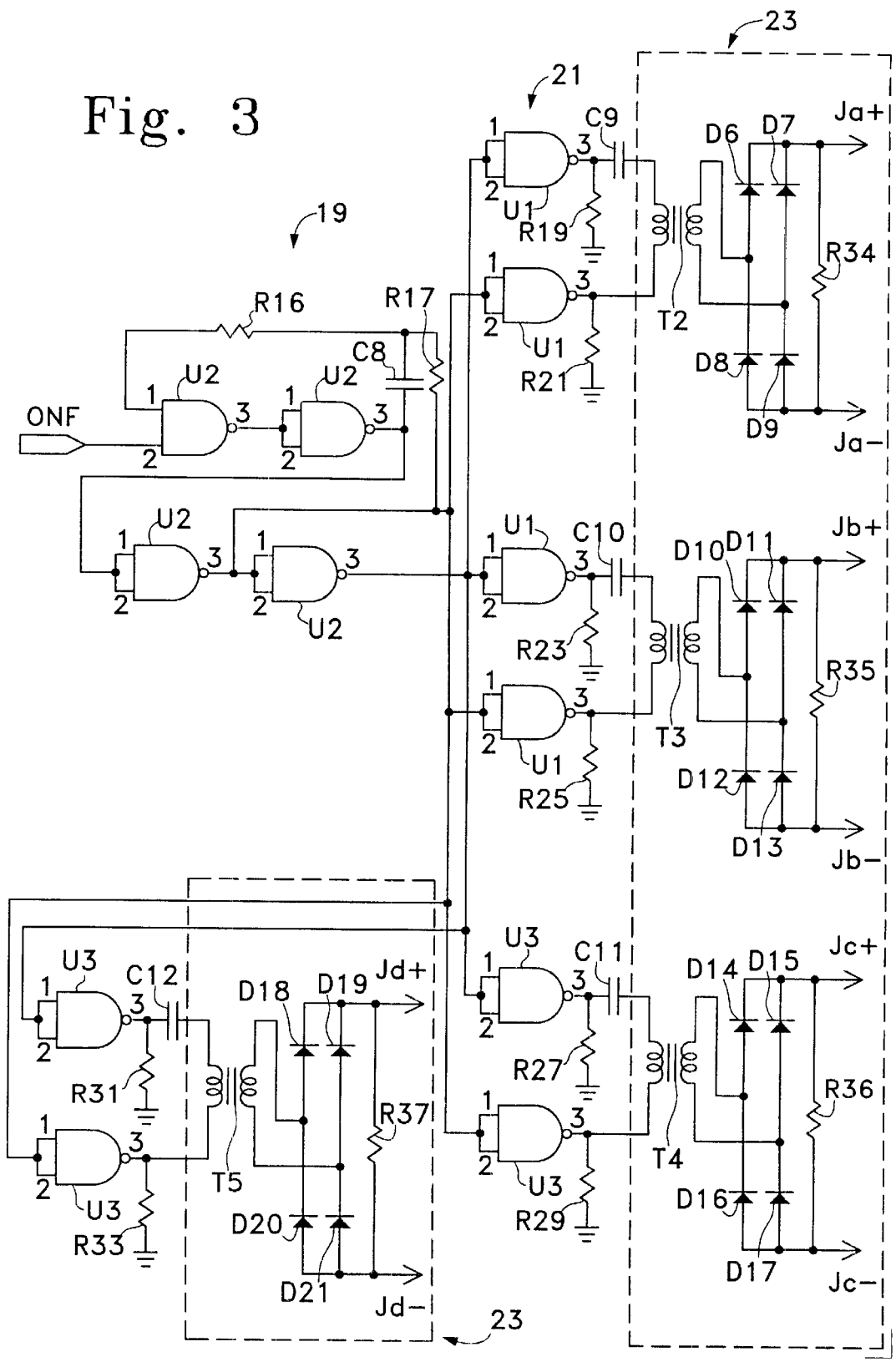
FIG. 3 shows the circuit diagram of the CMOS oscillator & isolating transformers unit.

The CMOS oscillator & isolating transformers unit 5 converts Vcc (when ONF reaches 15 V) into an AC voltage and then transfers this AC voltage by means of transformers to a full-wave rectifier for conversion back to DC voltages. The circuit diagram for the CMOS oscillator & isolating transformers unit 5 is shown in FIG. 3.

The conversion of Vcc into an AC voltage is accomplished by the circuit 19 consisting of the quad NAND gate U2 (4011), resistors R16 (16 kΩ) and R17 (16 kΩ), and capacitor C8 (68 pF). The circuit 19 is enabled by ONF and produces a square wave.

The circuit 21 consisting of the quad NAND gates U1 and U3 (both 4011), resistors R19, R21, R23, R25, R27, R29, R31, and R33 (all 56 kΩ), and capacitors C9, C10, C11, and C12 (all 10 nF) acts as a buffer between circuit 19 and circuit 23.

The circuit 23 converts the four square-wave AC voltages supplied by circuit 21 to DC voltages by means of the diode bridges consisting of diodes D6, D7, D8, and D9, diodes D10, D11, D12, and D13, diodes D14, D15, D16, and D17, and diodes D18, D19, D20, and D21( all 1N4148). The toroid transformers T2, T3, T4, and T5 provide complete electrical isolation of circuit 23 and the switches which are driven by circuit 23 from circuit 19, circuit 21, and constant-current supply & on/off control unit 3. The resistors R34, R35, R36, and R37 (all 20 kΩ) provide light loads to the diode rectifiers.

The outputs (Ja+, Ja−), (Jb+, Jb−), (Jc+, Jc−), and (Jd+, Jd−) from circuit 23 are switch control voltages which drive two normally-open (NO) switches and two normally-closed (NC) switches. The normal voltage range of the switch control voltages extends from 0 V to the threshold voltages of the MOSFETs. The activating range of the switch control voltages extends downward from 15 V to a voltage sufficient to support the amount of current that is to flow through the switch. The actual switch control voltages, because of the design, will be either close to 0 V or close to 15 V.

It is well known that turning on a power MOSFET requires a gate drive circuit strong enough to charge up the gate capacitance and handle the charge flow resulting from the drain-gate voltage change. This requirement is of particular importance when high voltages are involved since the charge associated with the drain-gate capacitance is large in the case of high-voltage power MOSFETs. Such MOSFETs are almost impossible to drive with weak CMOS-logic integrated circuits. This invention solves the drive problem by using a parallel combination of power MOSFETs with increasing current-carrying capacities and turning on the power MOSFETs in the sequence of their current-carrying capacities.

Figure 4:
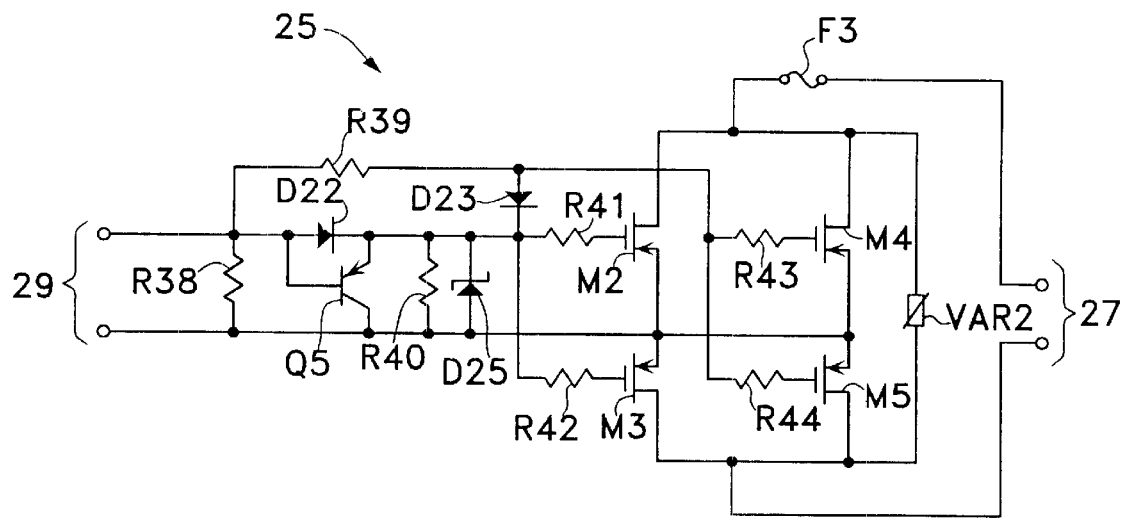
FIG. 4 shows the circuit diagram of the normally-open switch.

The circuit diagram of the NO switch 25 is shown in FIG. 4. The MOSFETs M2 and M4 constitute a first MOSFET assembly and MOSFETs M3 and M5 constitute a second MOSFET assembly. MOSFETs M2 and M3 (both IRF830) are of lower current-carrying capacity and have lower capacitances than MOSFETs M4 and M5 (both IRF740). The drains of the MOSFETs connect to switch terminals 27 which can be used to connect the switch into an electrical circuit.

The reason for having two MOSFET assemblies connected back to back is to permit the voltage appearing across the switch terminals 27 to be of arbitrary polarity. When the MOSFETs are turned off, one or the other MOSFET assembly blocks the flow of current, regardless of the polarity of the switch-terminal voltage.

Polarity independent performance could also be attained with a single MOSFET assembly by incorporating a diode bridge as described below in connection with the NC switch.

The fuse F3 (15 A) isolates the switch from the electrical circuit to which it is connected in case of a short-circuit or some other fault creating a high-current condition.

The varistor VAR2 (TNR15G271K) absorbs any transient voltages which may be generated by inductive elements in the electrical circuit to which the switch is connected.

The switch control voltage enters NO switch 25 at switch control terminals 29. When the switch control voltage transitions from the normal voltage range to the activating voltage range, the transition appears almost immediately at the gates of MOSFETs M2 and M3. These MOSFETs are of a low-current type with small capacitances, and they are turned on relatively easily by weak gate drives. But these MOSFETs do not have enough current-carrying capacity to carry the full switch current continuously. However, they discharge the drain-gate capacitances of MOSFETs M4 and M5 which causes the drain-source voltage of the two MOSFETs to be zero momentarily The resistor R39 (3.3 kΩ) delays the appearance of the switch control voltage transition at the gates of MOSFETs M4 and M5 until the drain-source voltages have reached zero, and the two MOSFETs turn on with zero drain-source voltage. Thus, the MOSFET pair is turned on by the relatively weak CMOS integrated circuits. This method works well with discrete MOSFET pairs, but it would be ideal to have the MOSFETs fabricated on a single chip. On the chip level, the number of MOSFETs in parallel is not restricted, and it would be possible to optimize the delays for groups of small MOSFET cells so as to optimize the switching.

The resistors R41, R42, R43, and R44 (all 50Ω) prevent parasitic oscillations. Diode D23 (1N4148) and transistor Q5 (9012) provide a discharge path for the gates of the MOSFETs when the switch is opened. The Zener diode DZ5 (18 V) limits the gate-source voltage of the MOSFETs. The diode D22 (1N4148) turns off the transistor Q5 when the switch is closed. The resistor R38 provides a light load which causes the voltage across switch terminals 29 to go to zero when the switch is not connected.

Figure 5:
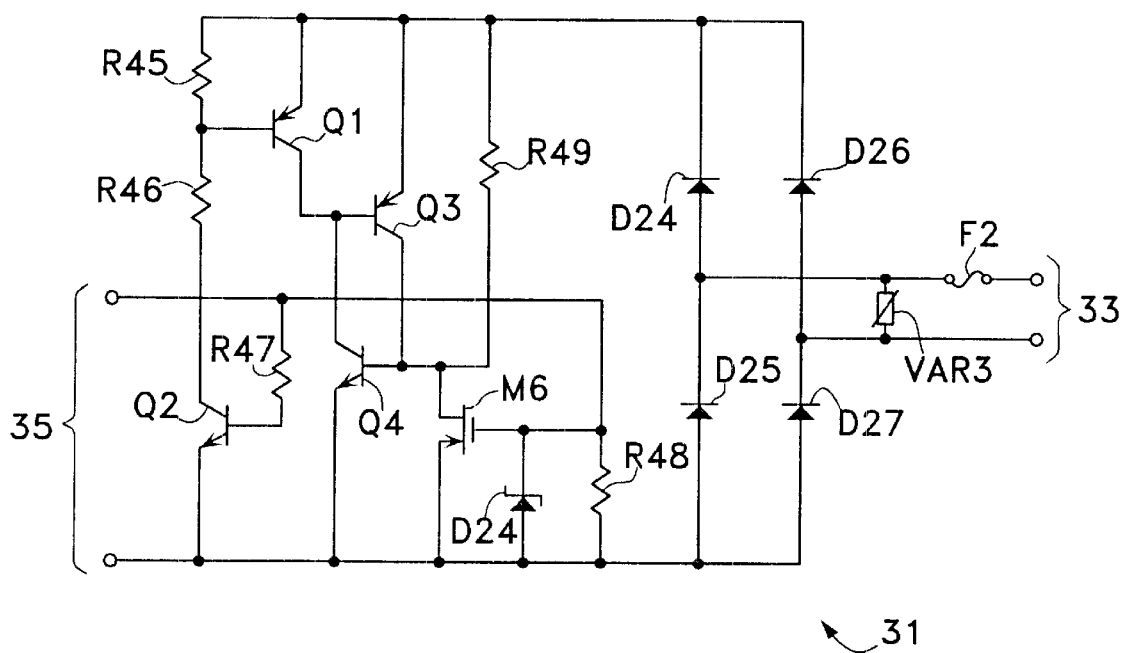
FIG. 5 shows the circuit diagram of the normally-closed switch.

The circuit diagram of the NC switch 31 is shown in FIG. 5. The pnp bipolar transistor Q3 (MJ15025) and the npn bipolar transistor Q4 (MJ15024) form the main part of the normally-closed switch. The emitters of the two transistors connect through the diode bridge consisting of diodes D24, D25, D26, and D27 (all 6A4) to the switch terminals 33. The switch terminals 33 provide the means for connecting the switch into an electrical circuit. The purpose of the diode bridge is to convert a voltage across the switch terminals 33 of arbitrary polarity into a voltage of fixed polarity across transistors Q3 and Q4, the Q3 emitter being positive with respect to the Q4 emitter.

The fuse F2 (15 A) isolates the switch from the electrical circuit to which it is connected in case of a short-circuit or some other fault creating a high-current condition.

The varistor VAR3 (TNR23G181K) absorbs any transient voltages which may be generated by inductive elements in the electrical circuit to which the switch is connected.

The driving circuit for the NC switch 31 consists of the MOSFET M6 (MTP50N05E), the bipolar transistors Q1(9012) and Q2 (MPSA42), and the resistors R45 (680 kΩ), R46 (680 kΩ), R47 (20 kΩ), R48 (560 kΩ), and R49 (1 MΩ).

If the switch control voltage at switch control terminals 35 is zero, MOSFET M6 is turned off. The base-emitter junction of transistor Q2 is short-circuited thereby causing Q2 to be turned off. Since no current is flowing through Q2, the voltage across the base-emitter junction of transistor Q1 is zero, and Q1 is also turned off. Under these conditions any voltage at terminals 33 will cause current to flow through transistors Q3 and Q4. Thus, switch 31 is normally closed. The resistor R49 enhances the triggering sensitivity of the switch when the switch control voltage is in the normal voltage range.

When the switch control voltage at switch control terminals 35 transitions from the normal voltage range to the activating voltage range, MOSFET M6 begins to conduct and short-circuits the base-emitter junction of transistor Q4, thereby causing Q4 to stop conducting current. At the same time, Q2 begins to conduct causing Q1 to conduct and short-circuit the base-emitter junction of transistor Q3 which causes Q3 to also stop conducting current. Thus, the switch control voltage, in moving to the activating voltage range, causes the normally-closed switch 31 to close.

What is claimed is:

1. Apparatus for opening and closing an external electrical circuit (EEC), the apparatus comprising:

a switch comprising a plurality of EEC transistors connected to first and second switch terminals to which an EEC can be connected and a turn-off means for causing the EEC transistors to be turned off simultaneously when the switch is to be opened, the EEC transistors being the transistors through which the current from the EEC flows when the switch is closed, no current from the EEC flowing through the switch terminals when the switch is open, the only voltage appearing across the switch terminals being that supplied by the EEC.

2. The apparatus of claim 1 wherein the switch is a normally-open switch, the switch including first and second input switch terminals, the EEC transistors being the transistors in one or more MOSFET assemblies, each MOSFET assembly consisting of a plurality of MOSFETs, the MOSFETs in a MOSFET assembly being connected in parallel and numbered from one to N, the n'th MOSFET having a greater current-carrying capacity than the (n−1)'th MOSFET, n taking on values between 2 and N, the gate of each MOSFET connecting either directly or through a resistor to a gate terminal, the first input switch terminal connecting through either a resistor or a diode to the gate terminals, a switch control voltage applied across the input switch terminals in a normal voltage range causing the MOSFETs to be turned off, the switch control voltage in an activating voltage range causing the MOSFETs to be turned on, a transition of the switch control voltage from the normal range to the activating range causing the MOSFETs in the MOSFET assemblies to be turned on in a predetermined sequence, a transition of the switch control voltage from the activating range to the normal range causing the MOSFETs in the MOSFET assemblies to be turned off simultaneously.

3. The apparatus of claim 2 wherein the switch comprises a means for disconnecting the first input switch terminal from the gate terminals of the MOSFETs and for discharging the gates of the MOSFETs through a bipolar transistor while the switch control voltage moves from the activating voltage range to the normal voltage range.

4. The apparatus of claim 2 wherein the switch comprises a single MOSFET assembly, the sources and the drains of the MOSFETs being connected through one or more diodes to the switch terminals.

5. The apparatus of claim 2 wherein the switch comprises a varistor connected across the switch terminals.

6. The apparatus of claim 2 wherein the means for turning on the MOSFETs in time sequence comprises resistors of different values in the conducting lines running between the first input switch terminal and the gate terminals of all but one MOSFET in each MOSFET assembly, the means for turning off the MOSFETs comprising a diode connected between the gate terminal of the n'th MOSFET and the gate terminal of the m'th MOSFET in each MOSFET assembly, n taking on values from 2 through N, m being less than n.

7. The apparatus of claim 2 wherein the switch comprises a single MOSFET assembly, the switch further comprising a means for accommodating a current flow in either direction through the switch terminals.

8. The apparatus of claim 7 wherein the means for accommodating a current flow in either direction through the switch terminals consists of a diode bridge, two opposing terminals of the bridge being connected across the the MOSFET assembly, the other two opposing terminals being connected to the switch terminals.

9. The apparatus of claim 2 wherein the switch comprises two MOSFET assemblies, the sources of the MOSFETs in the two MOSFET assemblies being connected together, the drains of the MOSFETs in one MOSFET assembly being connected to the first switch terminal, the drains of the MOSFETs in the other MOSFET assembly being connected to the second switch terminal.

10. The apparatus of claim 2 wherein the switch comprises for each MOSFET assembly (1) resistors of different values in the conducting lines running between the first input switch terminal and the gate terminals of all but one MOSFET and (2) a means for disconnecting the first input switch terminal from the gate terminals of the MOSFETs and for discharging the gates of the MOSFETs through a bipolar transistor while the switch control voltage moves from the activating voltage range to the normal voltage range.

11. The apparatus of claim 2 wherein the switch comprises for each MOSFET assembly a diode connected between the gate terminal of the n'th MOSFET and the gate terminal of the m'th MOSFET, n taking on values from 2 through N, m being less than n.

12. The apparatus of claim 1 wherein the switch is a normally-closed switch, the switch including first and second input switch terminals, the EEC transistors being a first pup bipolar transistor and an npn bipolar transistor, the turn-off means being a means for short-circuiting the emitter-base junctions of the first pnp transistor and the npn transistor, the base and the collector of the npn transistor being connected respectively to the collector and the base of the first pnp transistor, a switch control voltage applied across the input switch terminals in a normal voltage range causing the EEC transistors to be turned on, the switch control voltage in an activating voltage range causing the EEC transistors to be turned off by short-circuiting the base-emitter junctions of the two transistors, the emitters of the first pnp transistor and the npn transistor being connected either directly or through one or more conductive devices to the two switch terminals.

13. The apparatus of claim 12 wherein the means for short-circuiting the base-emitter junction of the npn transistor is a MOSFET.

14. The apparatus of claim 12 wherein the means for short-circuiting the base-emitter junction of the first pnp transistor includes a second pnp transistor bridged across the base-emitter junction of the first pnp transistor.

15. The apparatus of claim 12 wherein the switch includes a means for accommodating a current flow in either direction through the switch terminals.

16. The apparatus of claim 15 wherein the means for accommodating a current flow in either direction through the switch terminals consists of a diode bridge, two opposing terminals of the bridge being connected across the EEC transistors, the other two opposing terminals being connected to the switch terminals.

17. The apparatus of claim 1 further comprising two relay control terminals for receiving a relay control voltage from an external source, the relay control voltage having a normal voltage range and an activating voltage range corresponding respectively to the normal voltage range and the activating voltage range of the switch control voltage, the apparatus further comprising a means for transforming the relay control voltage into the switch control voltage through one or more transformation stages, at least one transformation stage being coupled to the next transformation stage by a transformer.

18. The apparatus of claim 17 wherein one of the transformation stages is a DC/AC converter stage which converts a DC voltage to an AC voltage when the relay control voltage is in the activating voltage range.

19. The apparatus of claim 18 wherein the DC/AC converter stage comprises an oscillator.

20. The apparatus of claim 18 wherein the DC/AC converter stage transforms a DC voltage to an AC voltage beginning at a predetermined time period after the relay control voltage enters the activating voltage range.

21. The apparatus of claim 18 further comprising an enclosure and a means for suppressing the transmission of switching noise resulting from the operation of the DC/AC converter stage out of the enclosure via conductors connecting to the relay control terminals.

22. The apparatus of claim 17 wherein the power required to operate the apparatus is supplied by the external source through the relay control terminals, the apparatus further comprising a means for maintaining the current from the external source at a constant level while the relay control voltage is in the activating voltage range.

23. The apparatus of claim 17 wherein one of the transformation stages is an AC/DC converting stage which converts an AC relay control voltage or a DC relay control voltage of arbitrary polarity to a DC voltage having a predetermined polarity when the relay control voltage is in the activating voltage range.

24. The apparatus of claim 17 wherein one of the transformation stages converts the relay control voltage to a constant DC voltage when the relay control voltage is in the activating voltage range.

25. A method for using the apparatus of claim 1, the method comprising the steps:
  (a) activating the switch:
  (b) deactivating the switch.

26. The method of claim 25 wherein the EEC transistors are MOSFETs, step (a) comprising the step:
  (a1) turning the MOSFETs on in sequence.

27. The method of claim 25 wherein the EEC transistors are MOSFETs, step (b) comprising the step:
  discharging the gates of the MOSFETs simultaneously.

28. The method of claim 25 comprising the step:
  (c) translating the voltage appearing across the switch terminals to a voltage having the same magnitude and a specified polarity prior to being applied to the EEC transistors.

29. The method of claim 25 further comprising the step:
(c) absorbing transient voltages generated by inductive elements in the external electrical circuit to which the switch is connected.

30. The method of claim 25 further comprising the step:
(c) accommodating a current flow in either direction through the switch terminals.

31. The method of claim 25 wherein the EEC transistors are MOSFETs, the method further comprising the step:
(c) connecting the MOSFETs in a way that enables current flow in either direction through the switch terminals.

32. The method of claim 25 wherein the EEC transistors are MOSFETs, step (a) comprising the step:
(a1) activating the MOSFETs in sequence; step (b) comprising the step:
(b1) deactivating the MOSFETs simultaneously.

33. The method of claim 25 wherein the EEC transistors are an npn bipolar transistor and a pnp bipolar transistor connected in series, step (a) comprising the step:
(a1) short-circuiting the base-emitter junctions of the EEC transistors.

34. The method of claim 25 wherein the EEC transistors are an npn bipolar transistor and a pnp bipolar transistor connected in series, step (b) comprising the step:
(b1) floating the bases of the EEC transistors.

35. The method of claim 25 wherein a relay control voltage is provided by an external source, the relay control voltage having a normal voltage range and an activating voltage range corresponding respectively to the normal voltage range and the activating voltage range of the switch control voltage, the method further comprising the step:

(c) transforming the relay control voltage into the switch control voltage in one or more transformation steps, one of the transformation steps being to transform a voltage derived from the relay control voltage into an AC magnetic field and then to transform the AC magnetic field into an AC voltage.

36. The method of claim 35 wherein one of the transformation steps is a DC/AC converting step which consists of converting a DC voltage derived from the relay control voltage into an AC voltage when the relay control voltage is in the activating voltage range.

37. The method of claim 36 wherein the DC/AC converting step converts the DC voltage to an AC voltage beginning at a predetermined time period after the relay control voltage enters the activating voltage range.

38. The apparatus of claim 35 wherein the power required to perform the steps of the method is supplied by an external source, the method further comprising the step of maintaining the current from the external source at a constant level while the relay control voltage is in the activating voltage range.

39. The method of claim 35 wherein one of the transformation steps is an AC/DC converting step which converts an AC relay control voltage or a DC relay control voltage of arbitrary polarity to a DC voltage having a predetermined polarity when the relay control voltage is in the activating voltage range.

40. The method of claim 35 wherein one of the transformation steps consists of converting the relay control voltage to a constant DC voltage when the relay control voltage is in the activating voltage range.

* * * * *